United States Patent
Shibayama et al.

(10) Patent No.: US 7,663,113 B2
(45) Date of Patent: Feb. 16, 2010

(54) SEMICONDUCTOR DEVICE AND RADIATION DETECTOR EMPLOYING IT

(75) Inventors: Katsumi Shibayama, Hamamatsu (JP);
Yutaka Kusuyama, Hamamatsu (JP);
Masahiro Hayashi, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 569 days.

(21) Appl. No.: 10/546,698

(22) PCT Filed: Feb. 26, 2004

(86) PCT No.: PCT/JP2004/002291

§ 371 (c)(1),
(2), (4) Date: Aug. 24, 2006

(87) PCT Pub. No.: WO2004/077549

PCT Pub. Date: Sep. 10, 2004

(65) Prior Publication Data

US 2007/0075408 A1 Apr. 5, 2007

(30) Foreign Application Priority Data

Feb. 27, 2003 (JP) .............................. 2003-051493

(51) Int. Cl.
*G01J 1/00* (2006.01)
*A61B 6/00* (2006.01)

(52) U.S. Cl. ............................ 250/370.09; 250/370.11; 370/98.8; 370/19

(58) Field of Classification Search ............ 250/370.09, 250/370.11; 378/98.8, 19
See application file for complete search history.

(56) References Cited

U.S. PATENT DOCUMENTS

| 6,671,347 | B2 | 12/2003 | Tashiro et al. | 378/98.8 |
| 6,703,617 | B1 * | 3/2004 | Spartiotis et al. | 250/370.09 |
| 6,707,066 | B2 * | 3/2004 | Morishita | 257/59 |
| 7,148,486 | B2 * | 12/2006 | Heismann et al. | 250/370.09 |

FOREIGN PATENT DOCUMENTS

EP 0 368 262 5/1990

(Continued)

*Primary Examiner*—Howard Weiss
*Assistant Examiner*—Steven H Rao
(74) *Attorney, Agent, or Firm*—Drinker Biddle & Reath LLP

(57) ABSTRACT

A wiring substrate to which a semiconductor element 10 is connected, is a wiring substrate 20 comprised of a glass substrate with through-hole groups 20d, each group consisting of a plurality of through holes 20c extending from input surface 20a to output surface 20b and formed in a predetermined array, and conductive members 21 formed on respective inner walls of the through holes 20c in each through-hole group 20d so as to establish electrical continuity between input surface 20a and output surface 20b. A bump electrode 12 of semiconductor element 10 connected to the input surface 20a corresponds to each through-hole group 20d, conductive member 21, and conductive part 22 formed in a region covering the through-hole group 20d, and is connected so that a portion of the bump electrode 12 enters into an interior of each of the through holes 20c. This provides a semiconductor device in which good connection is made between the semiconductor element and the corresponding conduction path in the wiring substrate, and a radiation detector using it.

8 Claims, 14 Drawing Sheets

FOREIGN PATENT DOCUMENTS

| | | |
|---|---|---|
| EP | 1 589 581 A1 | 10/2005 |
| EP | 1 589 582 A1 | 10/2005 |
| JP | 02-164045 | 6/1990 |
| JP | 03-51477 | 5/1991 |
| JP | 03-203341 | 9/1991 |
| JP | 10-056040 | 2/1998 |
| JP | 11-086930 | 3/1999 |
| JP | 11-121648 | 4/1999 |
| JP | 2001-053111 | 2/2001 |
| JP | 2001-330677 | 11/2001 |
| JP | 2003-017676 | 1/2003 |
| JP | 2003-264280 | 9/2003 |
| WO | WO 02/06865 A2 | 1/2002 |

\* cited by examiner

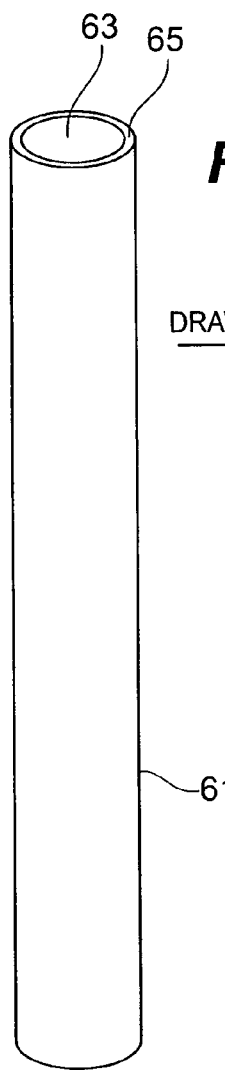
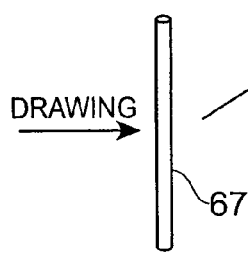
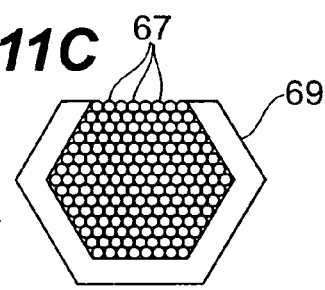
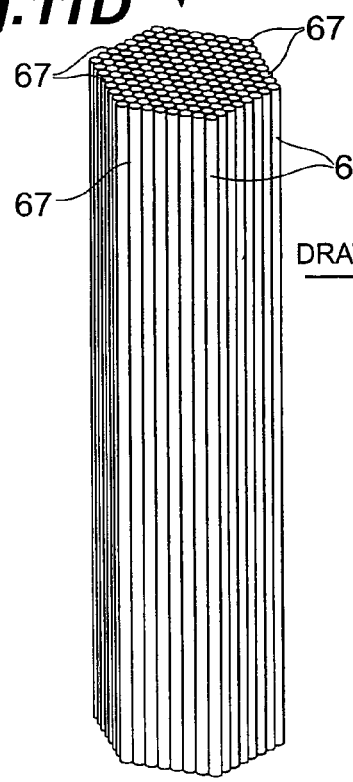
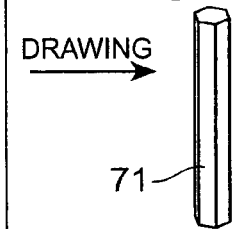
Fig.11A
Fig.11B
Fig.11C
Fig.11D
Fig.11E

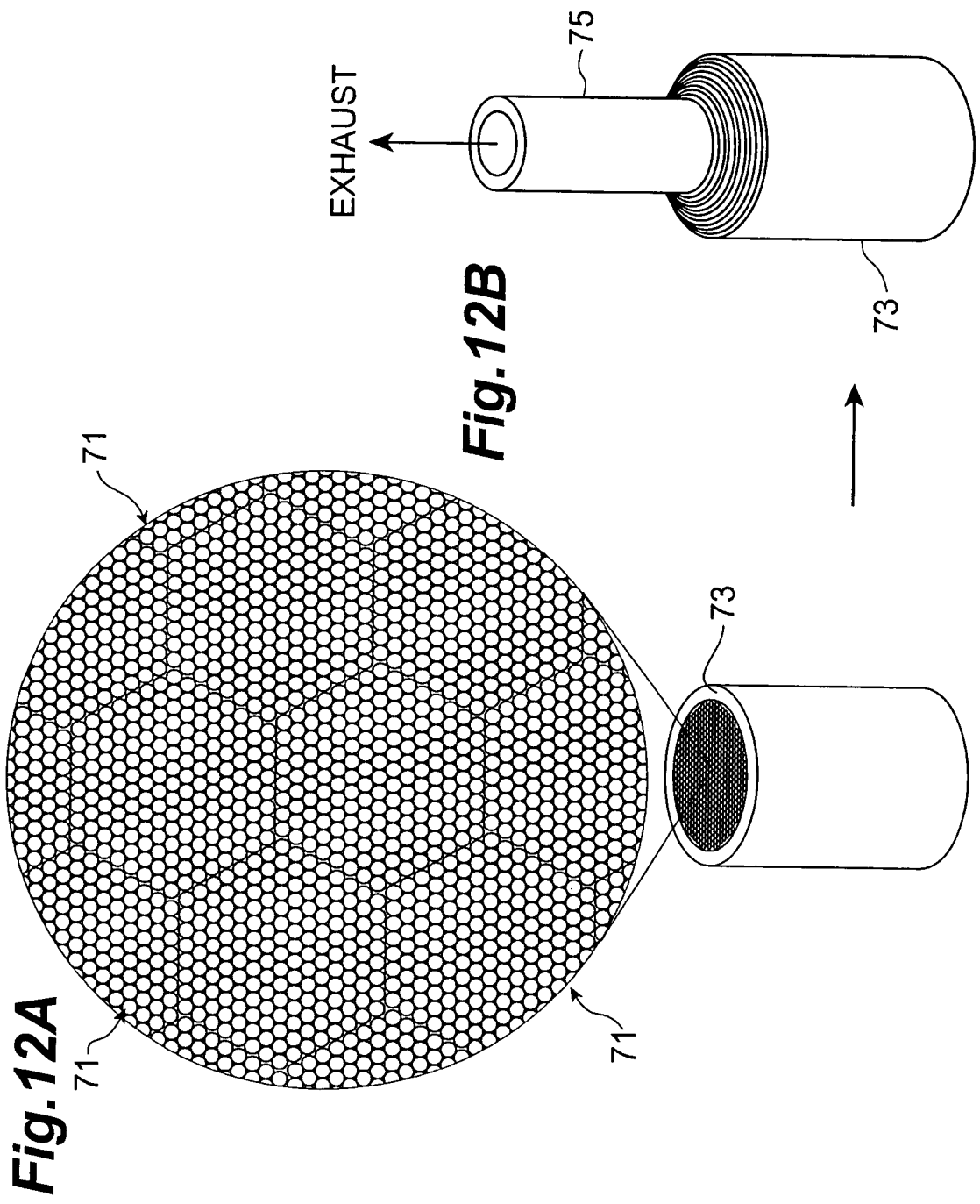

SEMICONDUCTOR DEVICE AND RADIATION DETECTOR EMPLOYING IT

TECHNICAL FIELD

The present invention relates to semiconductor device having a wiring substrate provided with a conduction path for guiding an electrical signal, and a radiation detector using it.

BACKGROUND ART

An example of the radiation detector used in a CT sensor or the like is a detector of a configuration wherein a scintillator is installed on a light-incident surface of a semiconductor photodetecting element. In the radiation detector of this configuration, scintillation light is generated with incidence of radiation, such as X-rays, γ-rays, or a charged particle beam, as an object to be detected, into the scintillator. Then the semiconductor photodetecting element detects the incident scintillation light from the scintillator to output the electrical signal corresponding to the intensity of the radiation.

A signal processing element is provided in order to perform signal processing of the electrical signal outputted from the semiconductor photodetecting element. In this connection, a semiconductor device is constructed in one united body by connecting a semiconductor element to a wiring substrate with a conduction path, as one of configurations for establishing electric connection between the semiconductor element and the signal processing element to transmit the electrical signal, and the signal processing element is arranged to be connected to the wiring substrate of this semiconductor device. Such semiconductor device using the wiring substrate is used in various applications other than the radiation detector (e.g., reference is made to Japanese Patent No. 2555720 and Japanese Patent Application Laid-Open No. H3-203341).

DISCLOSURE OF THE INVENTION

In the semiconductor device of the configuration wherein the semiconductor element is connected to the wiring substrate, a chip of the semiconductor element is mounted on the wiring substrate by flip chip bonding and on that occasion the semiconductor element is electrically connected through a bump electrode on the semiconductor element to a corresponding conduction path in the wiring substrate.

In this configuration, it is important to physically and electrically well connect the semiconductor element to the wiring substrate. In the connection configuration using the bump electrodes as described above, however, there could arise a problem in the connection between the semiconductor element and the wiring substrate due to the size and height of the bump electrodes, arrangement thereof, etc.; e.g., a large bump electrode excessively collapses, or adjacent bump electrodes come into contact with each other.

The present invention has been accomplished in order to solve the above problem, and an object of the invention is to provide a semiconductor device achieving good connection between the semiconductor element and the corresponding conduction path in the wiring substrate, and a radiation detector using it.

In order to achieve the above object, a semiconductor device according to the present invention is a device comprising: (1) a semiconductor element arranged to output an electrical signal; and (2) a wiring substrate provided with a conduction path for guiding the electrical signal between a signal input surface and a signal output surface, wherein the semiconductor element is connected to the signal input surface; (3) wherein the wiring substrate comprises an insulating substrate with a through-hole group consisting of a plurality of through holes, and conductive members provided in the respective through holes in the through-hole group and functioning as the conduction path while establishing electrical continuity between the signal input surface and the signal output surface, and (4) wherein the semiconductor element is electrically connected to the conductive members provided in the through-hole group of the wiring substrate, via a bump electrode formed corresponding to the through-hole group.

In the semiconductor device described above, the insulating substrate with the through-hole group consisting of the plurality of through holes extending from the input surface to the output surface and formed in a predetermined array is used as a wiring substrate for connecting the semiconductor element such as a semiconductor photodetecting element. The bump electrode of the semiconductor element is arranged to correspond to the through-hole group, and the semiconductor element is connected to the conductive members, which are conduction paths provided in the corresponding through-hole group in the wiring substrate.

In this configuration, on the occasion of mounting the semiconductor element on the wiring substrate, a portion of the bump electrode enters into the interior of each of the through holes in the through-hole group provided with the conductive members. This substantializes the semiconductor device achieving good connection through the bump electrode between the semiconductor element and the corresponding conduction path in the wiring substrate. In this case, as to the configuration of the conduction path in the wiring substrate, each of the conductive members is preferably formed on an inner wall of the through hole provided in the insulating substrate.

The insulating substrate of the wiring substrate is preferably a glass substrate with the through holes therein obtained by cutting a bundle of glass members, which are formed by bundling glass members of fiber shape each comprised of a core glass portion and a coating glass portion around the core glass portion, into a desired thickness and removing the core glass portions to form the through holes. This permits the wiring substrate to be constructed of the glass substrate in which the through holes for provision of the conductive members are formed in a desired diameter and pitch. In another aspect, the insulating substrate may be a glass substrate of any other configuration than the above, or an insulating substrate other than the glass substrate may be used.

The semiconductor device may be configured to further comprise signal processing means connected to the signal output surface of the wiring substrate and arranged to process the electrical signal from the semiconductor element. This obtains the semiconductor device of the configuration in which the electrical signal outputted from the semiconductor element is processed by the signal processing means.

A radiation detector according to the present invention is a radiation detector comprising the semiconductor device as set forth, the radiation detector comprising: (1) radiation detecting means including the semiconductor element, and arranged to detect an incident radiation to output the electrical signal; (2) the signal processing means for processing the electrical signal from the radiation detecting means; and (3) a wiring substrate section including the wiring substrate, wherein the radiation detecting means and the signal processing means are connected to the signal input surface and to the signal output surface, respectively.

In the above-described radiation detector, the wiring substrate constituting the above semiconductor device, together with the semiconductor element included in the radiation detecting means, is used as the wiring substrate section for establishing electric connection between the radiation detecting means and the signal processing means to transmit the electrical signal. Since this configuration achieves good connection between the semiconductor element and the corresponding conductive members in the wiring substrate, it substantializes the radiation detector capable of securely achieving the transmission of the electrical signal from the radiation detecting means to the signal processing means and processing of the electrical signal in the signal processing means.

In application of the above semiconductor device to the radiation detector as described above, the insulating substrate used in the wiring substrate is preferably a glass substrate made of a predetermined glass material with a radiation shielding function. This makes it feasible to suppress transmission of radiation from the radiation detecting means to the signal processing means. The glass material of this type is, for example, a glass material containing lead.

Concerning the configuration of the radiation detecting means, the radiation detecting means can be configured to have a scintillator for generating scintillation light with incidence of the radiation, and a semiconductor photodetecting element as the semiconductor element for detecting the scintillation light from the scintillator. In another configuration, the radiation detecting means may be configured to have a semiconductor detecting element as the semiconductor element for detecting the incident radiation.

BRIEF DESCRIPTION OF THE DRAWINGS

FIGS. 11A to 11E are illustrations showing an example of a production method of a wiring substrate.

FIGS. 12A and 12B are illustrations showing an example of a production method of a wiring substrate.

BEST MODE FOR CARRYING OUT THE INVENTION

Figure 1:
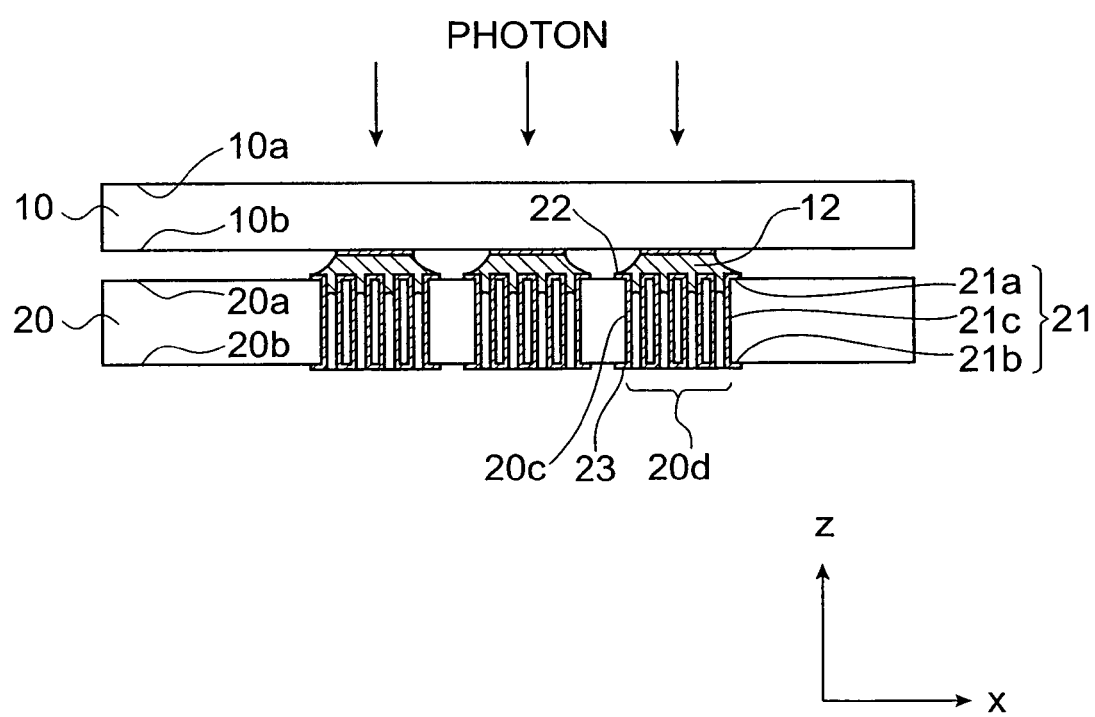
FIG. 1 is a sectional side view showing a sectional structure of an embodiment of the semiconductor device.

Preferred embodiments of the semiconductor device according to the present invention and the radiation detector using it will be described below in detail with reference to the drawings. The same elements will be described by the same reference symbols in the description of the drawings, without redundant description. It is noted that the dimensional ratios in the drawings do not always agree with those in the description.

Figure 2:
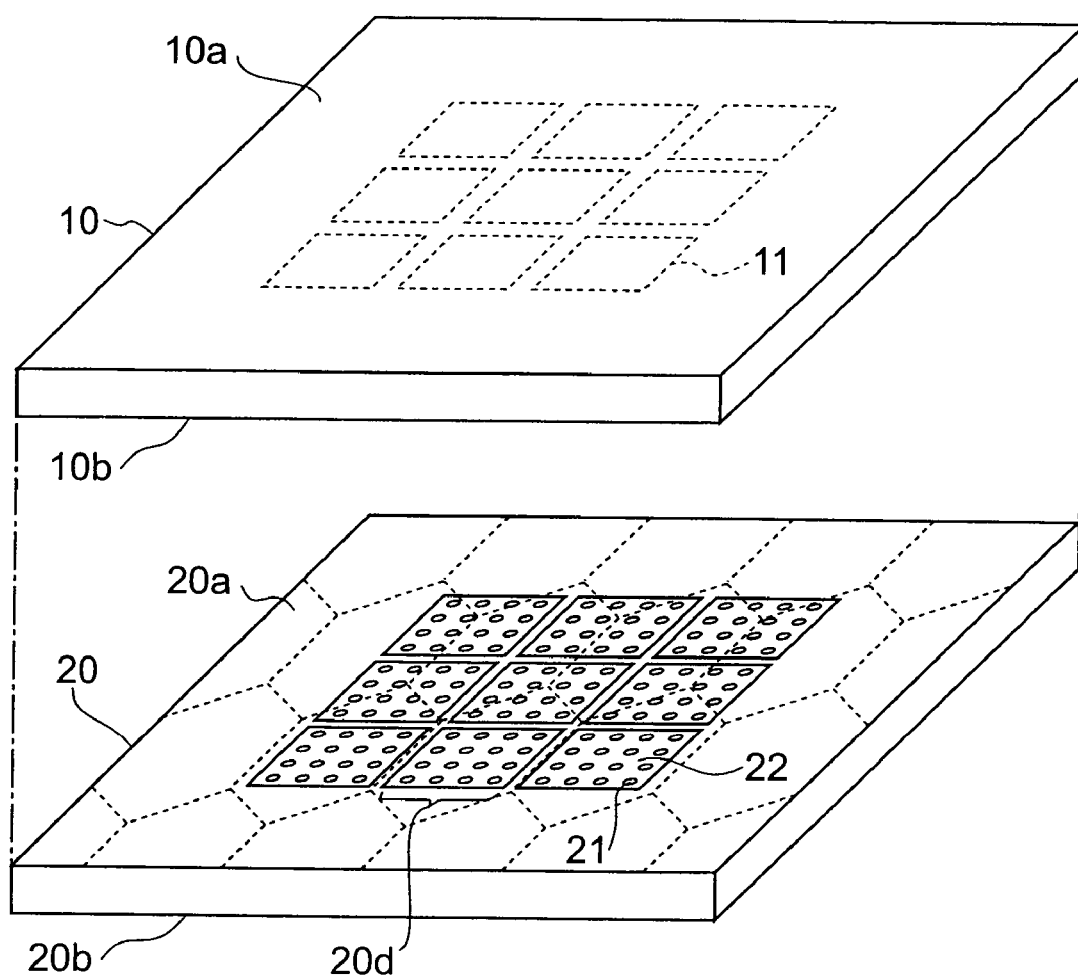
FIG. 2 is an exploded perspective view showing a configuration of the semiconductor device shown in FIG. 1.

FIG. 1 is a sectional side view showing a sectional structure of an embodiment of the semiconductor device according to the present invention. FIG. 2 is an exploded perspective view showing components in the configuration of the semiconductor device shown in FIG. 1. In each of the drawings hereinafter, for the convenience of description, a z-axis is defined as an axis along an conduction direction in the wiring substrate, and an x-axis and a y-axis are defined as two axes perpendicular to this z-axis, as shown in FIGS. 1 and 2.

In the after-described radiation detector using the semiconductor device, this z-axis is an axis along a direction in which the radiation is incident. In the configuration herein, the negative direction of the z-axis is the conduction direction from a signal input surface to a signal output surface in the wiring substrate, and alignment direction of the components in the semiconductor device or in the radiation detector.

The semiconductor device shown in FIG. 1 is provided with a semiconductor element 10, and a wiring substrate 20 to which the semiconductor element 10 is connected. These are arranged, as shown in FIG. 2, in that order from upstream (the upper side in the drawing) to downstream (the lower side) along the predetermined alignment direction. The following will describe an example in which the semiconductor element 10 is a photodiode array.

A photodiode array (PD array) 10 constitutes the upstream part of the semiconductor device. This PD array 10 is a semiconductor photodetecting element array in which a plurality of photodiodes (PDs) for detecting light incident through its light-incident surface 10a and outputting their respective electrical signals corresponding to the light are arrayed.

FIG. 2 shows the PD array in which 3×3=9 photodiodes 11 are two-dimensionally arrayed along array axes of the x-axis and y-axis, as a configuration example of PD array 10. The lower surface 10b of PD array 10 is a signal output surface for outputting detected signals from the respective photodiodes 11. On this signal output surface 10b there are nine bump electrodes 12 as electrodes for output of detected signals arrayed in a matrix of 3×3, corresponding to the respective photodiodes 11. Although not illustrated, a bump electrode for a substrate electrode (common electrode) is also provided in much the same form as the electrodes for output of detected signals.

The wiring substrate 20 constitutes the downstream part of the semiconductor device. This wiring substrate 20 is provided with conduction paths for guiding electrical signals between signal input surface 20a and signal output surface 20b, and the aforementioned PD array 10 is connected to the signal input surface 20a.

In the present embodiment, the wiring substrate 20 is constructed using a glass substrate obtained by bundling glass members of fiber shape (glass fibers) each including a core glass portion, and a coating glass portion provided around the core glass portion, to form a bundle of glass members, and cutting it into a desired thickness in a predetermined direction intersecting with the axis of the glass fibers.

Figure 3A:
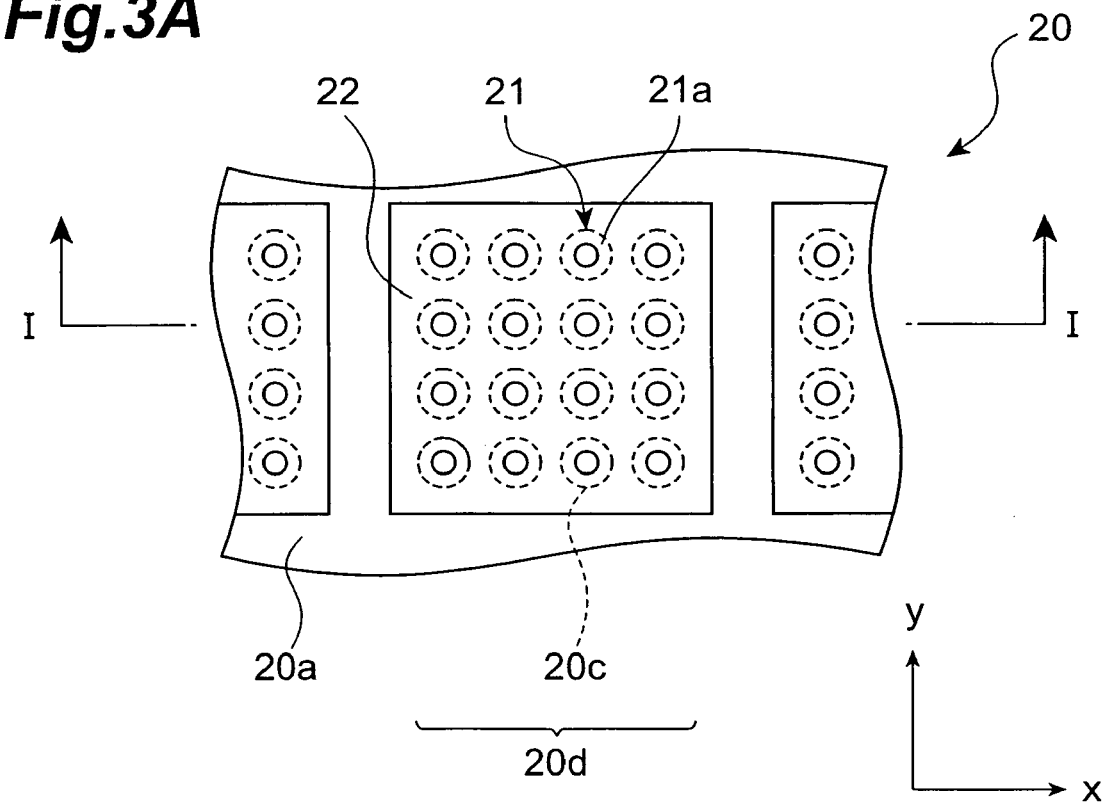
FIGS. 3A and 3B are views showing an example of a configuration of through holes in a wiring substrate, and conductive members in the through holes.
Figure 3B:
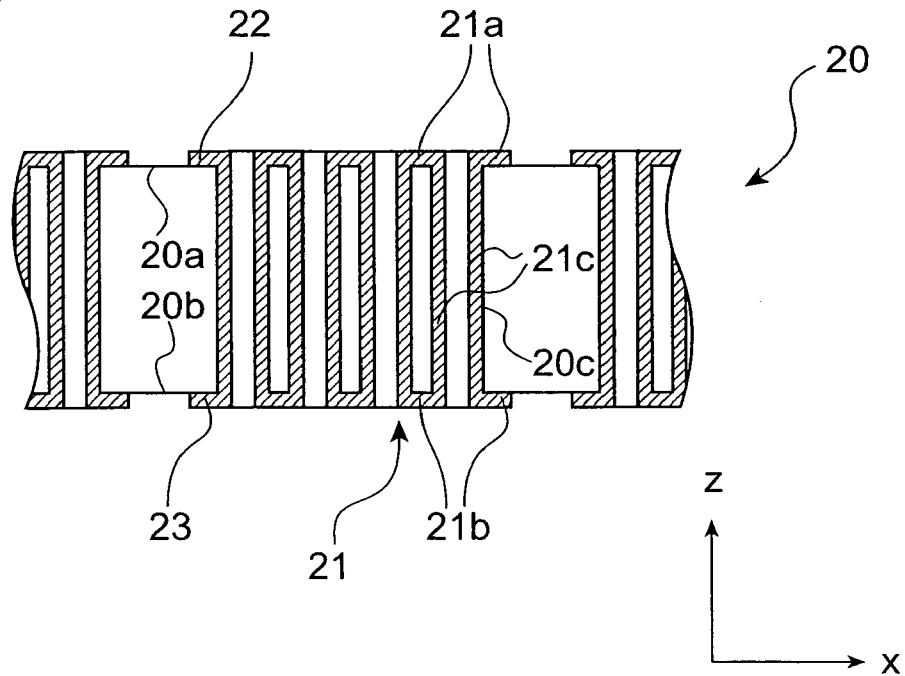

FIGS. 3A and 3B are views showing an example of the configuration of through holes 20c in the wiring substrate 20, and conductive members 21 provided in the through holes 20c, wherein FIG. 3A is a top plan view and FIG. 3B a sectional view taken along line I-I and viewed in the direction of arrows.

In the glass substrate constituting the wiring substrate 20, the core glass portions in the respective central regions are removed from predetermined glass fibers out of the plurality of glass fibers in the glass substrate to form through holes 20c extending from the signal input surface 20a to the signal output surface 20b.

In the present embodiment, as shown in FIG. 3A, 4×4=16 through holes 20c are formed as two-dimensionally arrayed along array axes of the x-axis and y-axis, and these sixteen through holes 20c constitute one through-hole group 20d. As shown in FIG. 2, corresponding to the array of photodiodes 11 in the PD array 10, there are 3×3=9 through-hole groups 20d provided in a two-dimensional array along the array axes of the x-axis and y-axis. In this configuration, the photodiodes 11 as semiconductor elements in the PD array 10 are in one-to-one correspondence to the through-hole groups 20d each having a plurality of through holes 20c in the wiring substrate 20.

The through-hole groups 20d are formed at the same pitch as the bump electrodes 12 on the PD array 10. Each through hole 20c, as shown in FIG. 3B, is formed in a circular sectional shape about a center axis on an axis perpendicular to the signal input surface 20a and signal output surface 20b of the wiring substrate 20.

A conductive member 21 for establishing electrical continuity between input surface 20a and output surface 20b to function as a conduction path is provided for each of the sixteen through holes 20c in each through-hole group 20d. This conductive member 21 is provided as a member formed on the inner wall of each through hole 20c in the glass substrate.

Specifically, as shown in FIGS. 3A and 3B, a conducting portion 21c is formed on the inner wall in each through hole 20c. An input portion 21a continuous to the conducting portion 21c is formed on the peripheral part of the through hole 20c on the input surface 20a. An output portion 21b continuous to the conducting portion 21c is formed on the peripheral part of the through hole 20c on the output surface 20b. These conducting portion 21c, input portion 21a, and output portion 21b constitute a conductive member 21 serving as a conduction path in the wiring substrate 20.

On the input surface 20a of the wiring substrate 20 a conductive part 22 is formed in such a region of square shape as to cover the sixteen through holes 20c in the through-hole group 20d, corresponding to each of the through-hole groups 20d. This conductive part 22 includes the input portions 21a of the sixteen conductive members 21 provided in the through holes 20c in each through-hole group 20d, and defines them as one united conductive member. The bump electrodes 12 on the PD array 10 are formed corresponding to the through-hole groups 20d, conductive members 21, and conductive parts 22 with respect to the input surface 20a of the wiring substrate 20, and the conductive parts 22 serve as electrode pads to which the bump electrodes 12 are connected.

Each bump electrode 12 is connected to the corresponding conductive members 21 and conductive part 22 in the wiring substrate 20 so that a portion of the bump electrode 12 enters into the interior of each or some of the sixteen through holes 20c provided with the conductive members 21 in the through-hole group 20d covered by the conductive part 22. In this configuration, each photodiode 11 for outputting the detected signal in the PD array 10 is electrically connected through a bump electrode 12 to conductive members 21 as conduction paths for transmitting the detected signal in the wiring substrate 20.

On the output surface 20b of the wiring substrate 20, just as on the input surface 20a, a conductive part 23 is formed in a region of square shape covering the sixteen through holes 20c included in the through-hole group 20d, corresponding to each of the through-hole groups 20d. This conductive part 23 includes the output portions 21b of sixteen conductive members 21 provided in the through holes 20c in the through-hole group 20d, and defines them as one united conductive member.

The effect of the semiconductor device according to the present embodiment will be described.

In the semiconductor device shown in FIGS. 1 to 3A, 3B, the glass substrate with the through-hole groups 20d each consisting of the plurality of through holes 20c in the predetermined array from the input surface 20a to the output surface 20b is used as the wiring substrate 20 for connection of the PD array 10 being the semiconductor element array. The bump electrodes 12 on the PD array 10 are provided corresponding to the through-hole groups 20d, whereby the photodiodes 11 of the PD array 10 being semiconductor elements are connected to the corresponding conductive members 21 in the wiring substrate 20.

In this configuration, on the occasion of mounting the PD array 10 on the wiring substrate 20, a portion of each bump electrode 12 enters into the interior of each or some of the through holes 20c in the corresponding through-hole group 20d provided with the conductive members 21. This achieves good connection through bump electrode 12 between each photodiode 11 in the PD array 10, and the conductive members 21 and conductive part 22 as a corresponding conduction path in the wiring substrate 20. The conductive members 21 in the wiring substrate 20 are preferably constructed using the members formed on the inner walls of through holes 20c, as shown in FIGS. 3A and 3B.

In the above embodiment, the glass substrate of the wiring substrate 20 is a glass substrate formed in one united body from a plurality of glass fibers and having the through holes 20c resulting from removal of the core glass portions, at predetermined positions thereof. This permits the wiring substrate 20 to be constructed of the glass substrate in which the through holes 20c for provision of the conductive members 21 are formed in the desired diameter and pitch. For example, in the glass substrate of the above configuration, the through holes 20c can be formed in a small diameter and pitch. In addition, it is feasible to facilitate increase of the area and decrease of thickness of the wiring substrate 20.

The substrate of the wiring substrate 20 may be a glass substrate of any configuration other than the above as long as it is provided with the through-hole group having the plurality of through holes as described above. The substrate may also be an insulating substrate other than the glass substrate. For example, applicable materials to the substrate include nonconductive inorganic materials such as glass, ceramics, or composite materials thereof; nonconductive organic materials such as epoxy, acrylic, polyimide, silicone, or composite materials thereof; composite materials of such inorganic materials and organic materials, and so on.

The configuration of the through holes in the insulating substrate such as the glass substrate does not always have to be limited to the above configuration of forming the through holes by removing the core glass portions of the glass fibers forming the glass substrate, either, and the through holes may be formed using a variety of configurations according to the configuration of the insulating substrate. For example, it is possible to use configurations of forming the through holes by etching or with a drill, a laser, or the like in the insulating substrate made of the predetermined insulating material.

Concerning the semiconductor element 10 connected to the wiring substrate 20, the above embodiment described the example using the photodiode array being the semiconductor photodetecting element array, but the semiconductor element 10 may be constructed using various semiconductor elements other than the photodiode array.

The connection between the bump electrodes 12 on the semiconductor element 10 and the conductive members 21 in the wiring substrate 20 in the semiconductor device of the above configuration will be further described below.

Figure 4A:
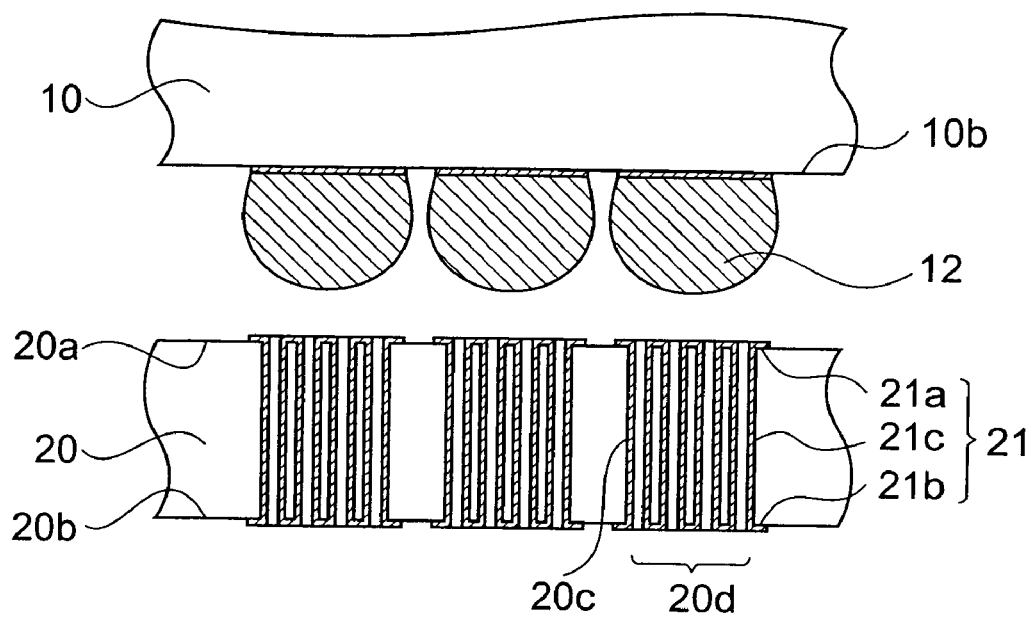
FIGS. 4A and 4B are views showing an example of connection between conductive members in through-hole groups in a wiring substrate, and bump electrodes.
Figure 4B:
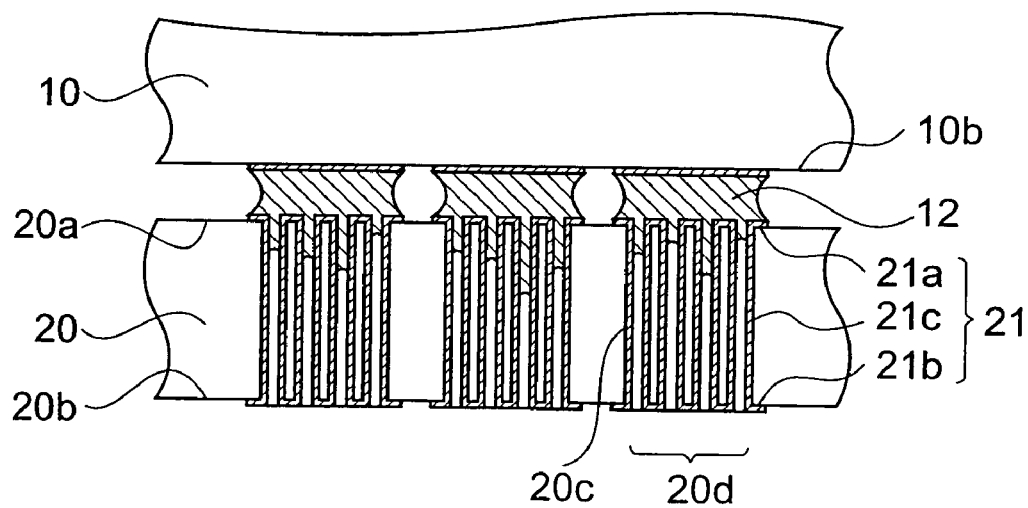

FIGS. 4A and 4B are views showing an example of the connection between the conductive members 21 in the through-hole groups 20d in the wiring substrate 20 and the bump electrodes 12 provided on the output surface 10b of the semiconductor element 10, wherein FIG. 4A shows a state before the connection and FIG. 4B a state after the connection.

In the present configuration example, as shown in FIG. 4A, the bump electrodes 12 for connection between semiconductor element 10 and wiring substrate 20 are arranged at a narrow pitch of bumps relative to the size thereof and with a narrow clearance between bump electrodes 12.

By using the wiring substrate 20 of the above configuration, the bump melts to flow in the extending direction of the through hole in each of the through holes 20c in the through-hole group 20d corresponding to the bump electrode 12, whereby a portion of the bump electrode 12 enters into the interior of the through holes 20c. This suppresses occurrence of failure of a short circuit resulting from contact between adjacent bump electrodes 12. It is also feasible to keep the gap uniform between the chip of semiconductor element 10 and the wiring substrate 20. Since the joint area increases between each bump electrode 12 and conductive members 21, the strength of the connection also increases between semiconductor element 10 and wiring substrate 20.

Figure 5A:
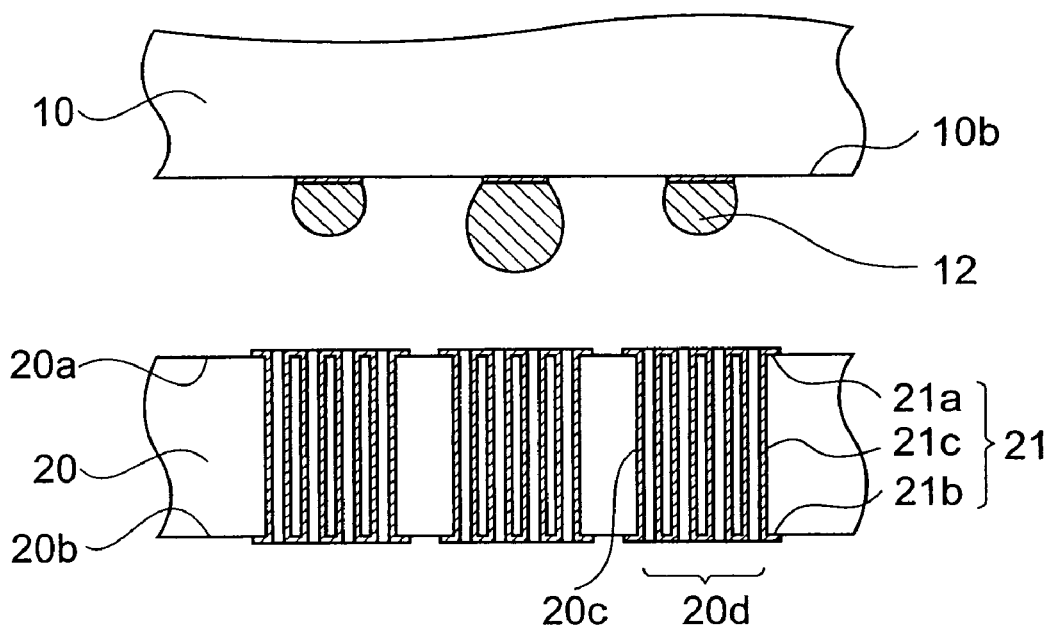
FIGS. 5A and 5B are views showing another example of connection between conductive members in through-hole groups in a wiring substrate, and bump electrodes.
Figure 5B:
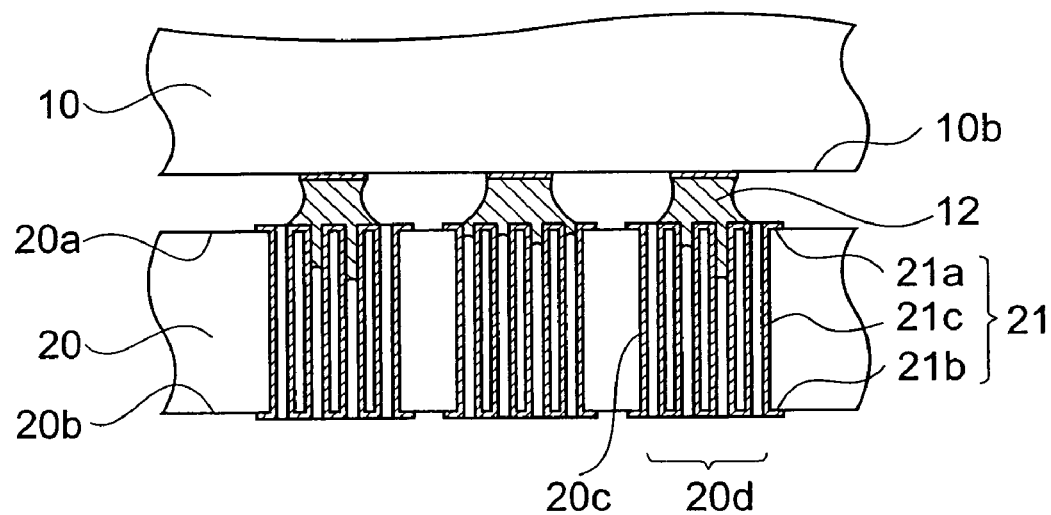

FIGS. 5A and 5B are views showing another example of the connection between the conductive members 21 provided in the through-hole groups 20d in the wiring substrate 20 and the bump electrodes 12 provided on the output surface 10b of semiconductor element 10, wherein FIG. 5A shows a state before the connection and FIG. 5B a state after the connection.

In the present configuration example, as shown in FIG. 5A, the bump electrodes 12 for connection between semiconductor element 10 and wiring substrate 20 are arranged in a configuration wherein there are bumps of different sizes and heights or where there is variation in size of bumps.

By using the wiring substrate 20 of the above configuration, a portion of bump electrode 12 enters into the interior of through holes 20c according to the size and height of bump electrode 12 in each of the through holes 20c or in some of the through holes 20c in the through-hole group 20d corresponding to the bump electrode 12. This suppresses occurrence of short-circuit failure resulting from contact between adjacent bump electrodes 12. It is also feasible to keep the gap uniform between the chip of semiconductor element 10 and the wiring substrate 20. Since the joint area increases between each bump electrode 12 and conductive members 21, the strength of the connection also increases between semiconductor element 10 and wiring substrate 20.

Figure 6:
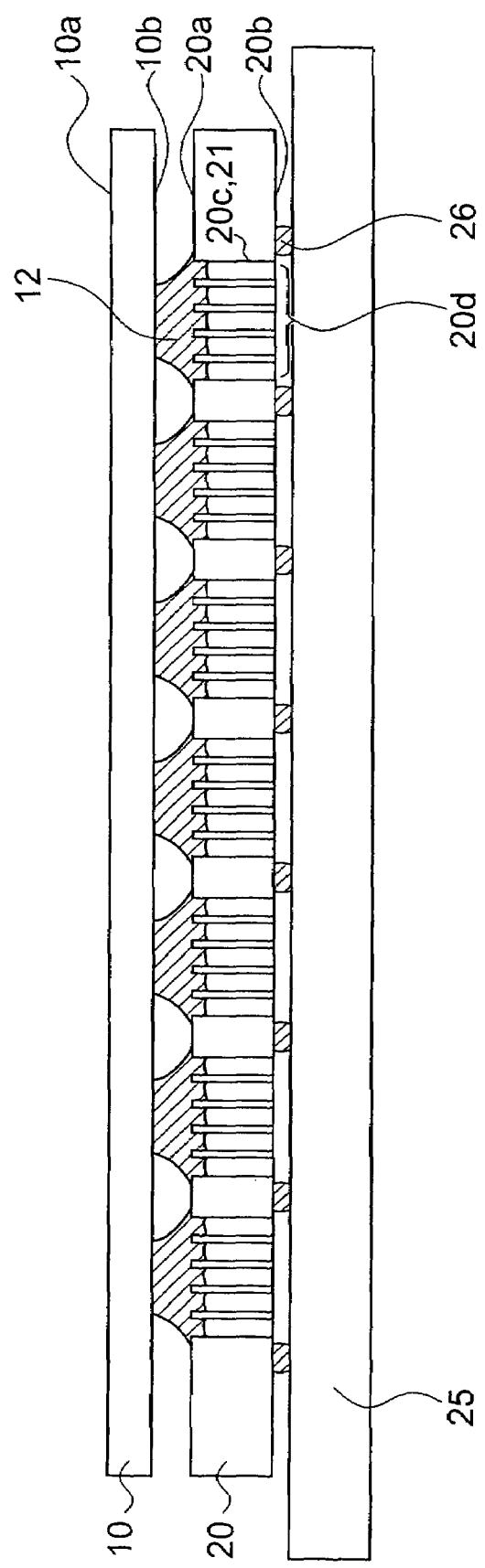
FIG. 6 is a sectional side view showing an example of the configuration of the semiconductor device.
Figure 7:
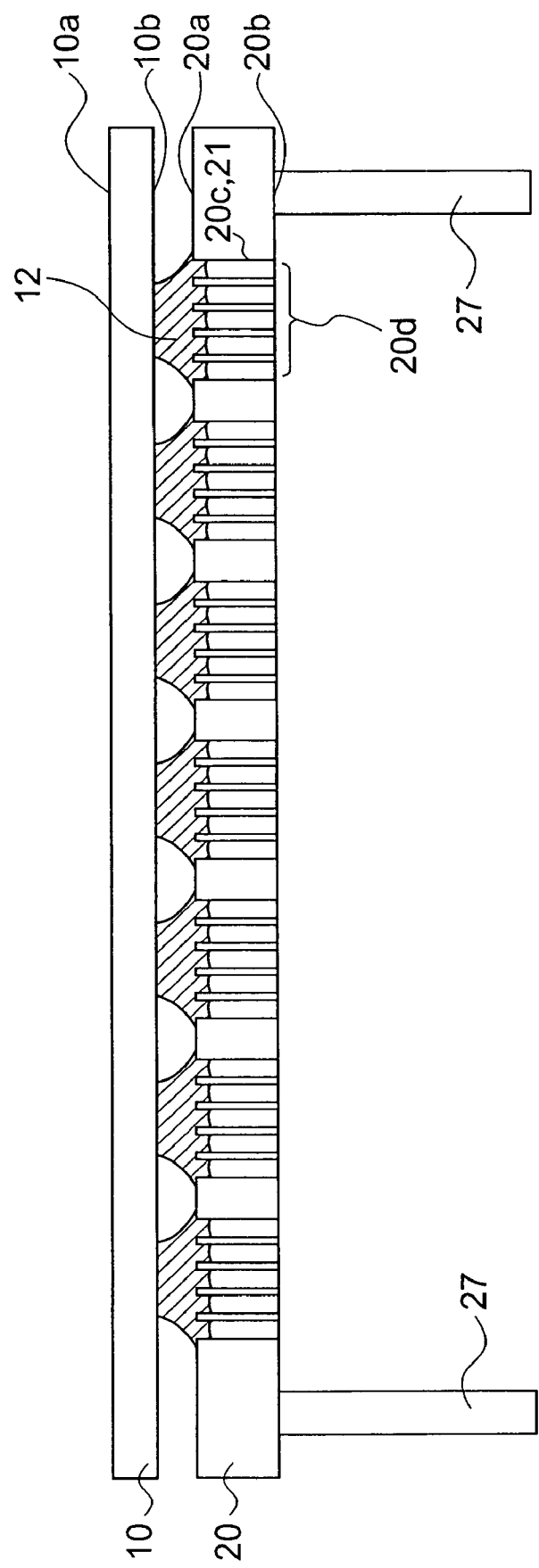
FIG. 7 is a sectional side view showing another example of the configuration of the semiconductor device.
Figure 8:
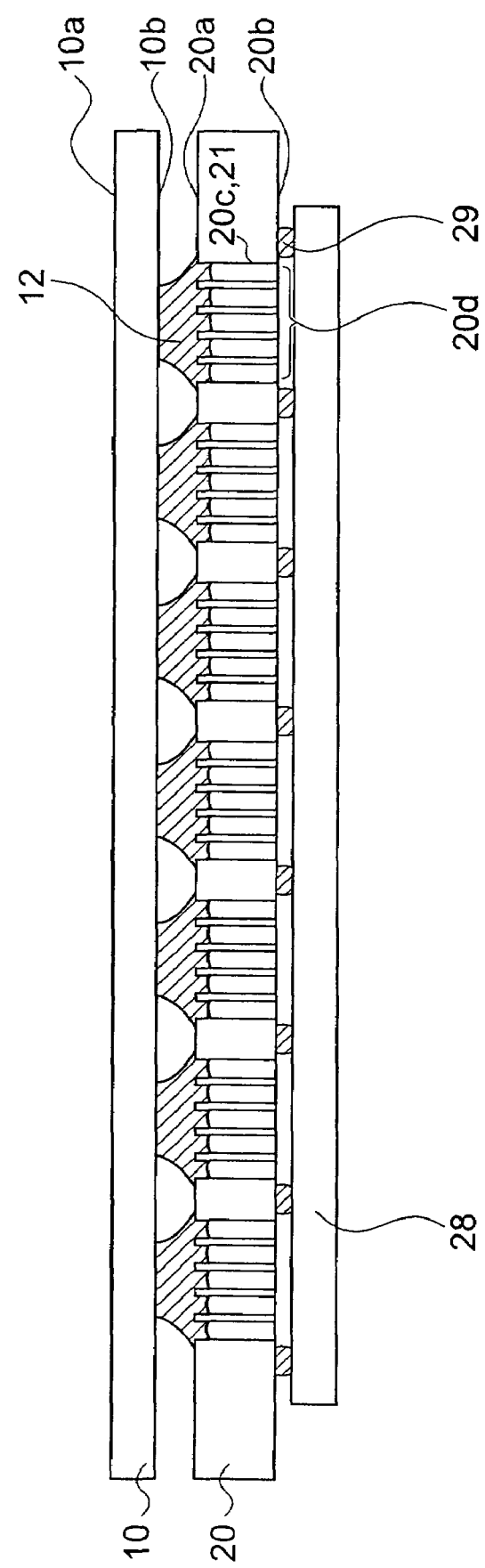
FIG. 8 is a sectional side view showing another example of the configuration of the semiconductor device.

Configurations of semiconductor device will be described with specific examples thereof. In FIGS. 6 to 8 below, for simplification of illustration, the configuration of wiring substrate 20 will be illustrated with only the through-hole groups 20d each having a plurality of through holes 20c, without illustration of wires, conductive members, and so on. The configurations of the conductive members 21 and conductive parts 22, 23 in the wiring substrate 20 are similar to those in the embodiment shown in FIGS. 1 to 3A, 3B.

FIG. 6 is a sectional side view showing an example of the configuration of the semiconductor device. In the present configuration example, another wiring substrate 25 is connected to the wiring substrate 20, to the input surface 20a of which the semiconductor element 10 is connected through bump electrodes 12, through the output surface 20b thereof and bump electrodes 26.

In this configuration, electrical signals from the semiconductor element 10 can be outputted to an external circuit or the like, through the conductive members 21 being conduction paths in the wiring substrate 20 and through conduction paths (not shown) in the wiring substrate 25.

FIG. 7 is a sectional side view showing another example of the configuration of the semiconductor device. In the present configuration example, the semiconductor element 10 is connected through bump electrodes 12 to the input surface 20a of the wiring substrate 20 to which lead wires 27 are connected to predetermined positions on the output surface 20b by soldering or brazing.

This configuration permits the electrical signals from the semiconductor element 10 to be outputted to an external circuit or the like through the conductive members 21 being the conduction paths in the wiring substrate 20 and through the leads 27. The leads 27 may be replaced by a configuration in which a flexible wiring substrate is connected by direct bump bonding, wire bonding, ACF, ACP, NCP, or the like.

FIG. 8 is a sectional side view showing another example of the configuration of the semiconductor device. In the present configuration example, a semiconductor element 28 is connected through bump electrodes 29 to the output surface 20b of the wiring substrate 20 to the input surface 20a of which the semiconductor element 10 is connected through the bump electrodes 12.

This configuration enables the control on the semiconductor element 10 by the semiconductor element 28, the control on the semiconductor element 28 by the semiconductor element 10, or mutual control of the semiconductor elements 10, 28 through input/output of electrical signals between the semiconductor elements 10, 28 through the conductive members 21 being the conduction paths in the wiring substrate 20. For example, where a signal processing element for processing electrical signals is used as the semiconductor element 28, the semiconductor device is obtained in a configuration wherein the signal processing element 28 processes the electrical signals outputted from the semiconductor element 10 such as the PD array. A resistive element, a capacitive element, or the like may also be connected in addition to the semiconductor element 28.

Next, a configuration of the radiation detector of the present invention using the above-described semiconductor device will be described below.

Figure 9:
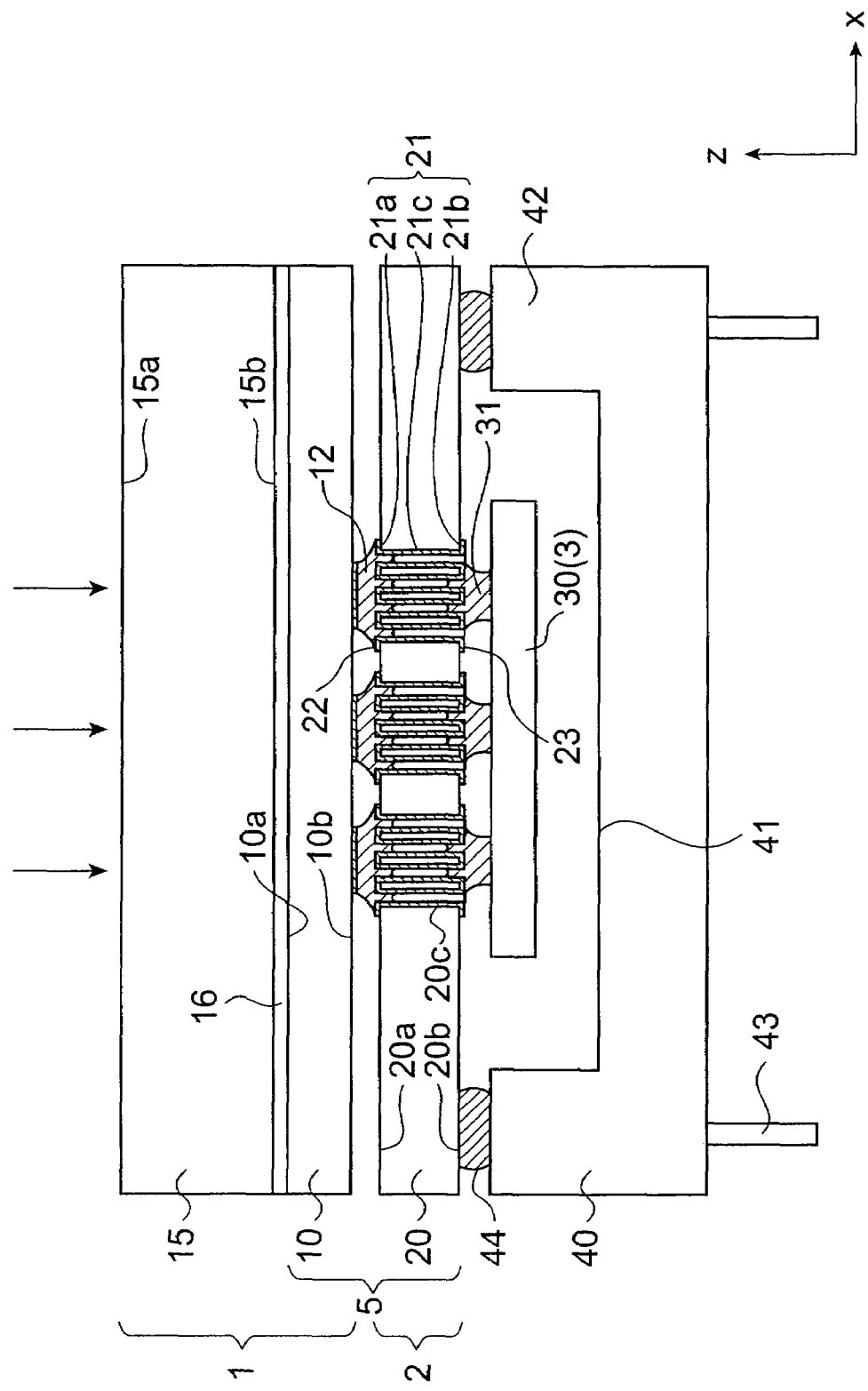
FIG. 9 is a sectional side view showing a sectional structure of an embodiment of the radiation detector using the semiconductor device shown in FIG. 1.
Figure 10:
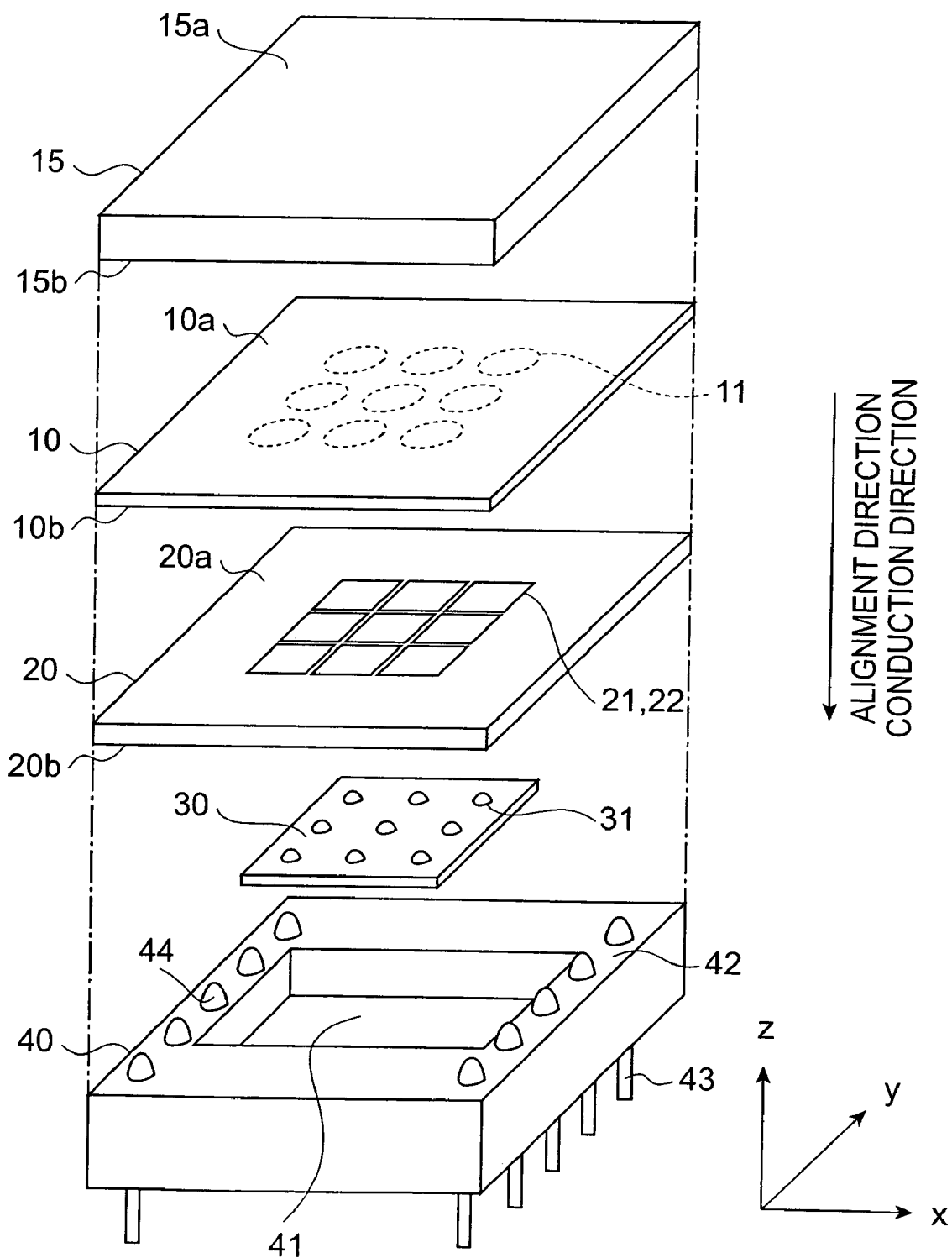
FIG. 10 is an exploded perspective view showing a configuration of the radiation detector shown in FIG. 9.

FIG. 9 is a sectional side view showing a sectional structure of an embodiment of the radiation detector using the semiconductor device shown in FIG. 1. FIG. 10 is an exploded perspective view showing components in the configuration of the radiation detector shown in FIG. 9. This figure shows only the major part, without illustration of the part corresponding to the substrate electrode on the PD array, and others.

The radiation detector shown in FIG. 9 is provided with a scintillator 15, a semiconductor device 5, and a signal processing section 3. These are arranged in that order from upstream (the upper side in the drawing) to downstream (the lower side) along the predetermined alignment direction, as shown in FIG. 10.

Among these, the configuration of the semiconductor device 5 comprised of PD array 10 and wiring substrate 20 is as described above about the semiconductor device shown in FIG. 1. Since in the present embodiment the semiconductor device 5 is applied to the radiation detector, the glass material of the glass substrate used in the wiring substrate 20 is preferably a predetermined glass material having a radiation shielding function, such as a lead glass material containing lead.

The scintillator 15 is installed upstream of the PD array 10 of the semiconductor device 5, and an upper surface 15a thereof serves as a radiation-incident surface in the radiation detector. When the radiation such as X-rays, γ-rays, or a charged particle beam as an object to be detected is incident upon the incident surface 15a, the scintillator 15 generates scintillation light of a predetermined wavelength. A light exit surface 15b, which is the lower surface of scintillator 15, is optically connected and bonded to the light-incident surface 10a being the upper surface of the PD array 10, through optical adhesive 16 which transmits the scintillation light.

Here the scintillator 15 and PD array 10 constitute a radiation detecting section 1 in the present radiation detector. This radiation detecting section 1 is a detecting means for detecting the incident radiation and outputting electrical signals corresponding to the intensity thereof. The wiring substrate 20 constitutes a wiring substrate section 2 which connects the radiation detecting section 1 to a signal processing section 3.

The signal processing section 3 and housing (package) 40 are installed downstream of the wiring substrate 20 of the semiconductor device 5. In the present embodiment, the signal processing section 3 is comprised of a signal processing element 30 provided with a signal processing circuit for processing detected signals from the PD array 10.

Bump electrodes 31 are formed on the upper surface of the signal processing element 30. The bump electrodes 31 are formed so as to correspond to the through-hole groups 20d, conductive members 21, and conductive parts 23, with respect to the output surface 20b of the wiring substrate 20, and the conductive parts 23 serve as electrode pads to which the bump electrodes 31 are connected. In this configuration, the conductive members 21 being the conduction paths for transmitting the detected signals in the wiring substrate 20 are electrically connected through the bump electrodes 31 to the signal processing circuit in the signal processing element 30.

The drawing shows only the bump electrodes corresponding to the signal outputs from the PD array, but wires for drive signals to the signal processing circuit and for output signals from the signal processing circuit are also connected similarly through bump electrodes to predetermined conductive parts (not shown) on the output surface 20b of the wiring substrate 20 and electrically connected through electrode pads (not shown) on the output surface 20b of the wiring substrate 20 and through bump electrodes 44 on the housing 40 to predetermined leads 43.

The housing 40 is a holding member which integrally holds the scintillator 15, the semiconductor device 5 comprised of PD array 10 and wiring substrate 20, and the signal processing element 30. This housing 40 has an element housing part 41 provided as a recess on the upper surface thereof and arranged to house the signal processing element 30 inside, and a supporting part 42 provided outside and around the element housing part 41, connected through bump electrodes 44 to electrode pads (not shown) at predetermined positions on the output surface 20b of the wiring substrate 20, and supporting the scintillator 15, semiconductor device 5, and signal processing element 30. Leads 43 used for input/output of electrical signals from and to the outside are provided on the lower surface of housing 40.

In the above configuration, when the radiation such as X-rays is incident on the scintillator 15 of the radiation detecting section 1, scintillation light is generated in the scintillator 15 and then enters the photodiodes 11 in the PD array 10 being the semiconductor element through the optical adhesive 16. The photodiodes 11 detect this scintillation light and output their respective electrical signals corresponding to the intensity of the radiation.

An electrical signal outputted from each photodiode 11 of the PD array 10 is successively guided through the corresponding bump electrode 12, conductive members 21 of wiring substrate 20, and bump electrode 31 to the signal processing element 30. Then the signal processing circuit of the signal processing element 30 performs signal processing necessary for the electrical signals.

The effect of the radiation detector of the present embodiment will be described below.

In the radiation detector shown in FIGS. 9 and 10, the wiring substrate 20 constituting the semiconductor device 5 together with the PD array 10 in the radiation detecting section 1 is used as the wiring substrate section 2 which establishes electric connection between the radiation detecting section 1 and the signal processing section 3 to transmit the detected signals. Since this configuration achieves good connection between photodiodes 11 of PD array 10 and conductive members 21 in the wiring substrate 20, it realizes the radiation detector capable of securely achieving the transmission of detected signals from the radiation detecting section 1 to the signal processing section 3 and the processing of detected signals in the signal processing section 3.

Where the semiconductor device comprised of the semiconductor element and the wiring substrate is applied to the radiation detector as described above, the insulating substrate used for the wiring substrate 20 is preferably a glass substrate made of a predetermined glass material having the radiation shielding function. This makes it feasible to suppress the transmission of radiation from the radiation detecting section 1 located on the upper surface 20a side of the wiring substrate 20 to the signal processing section 3 located on the lower surface 20b side.

The glass material of this type is, for example, a glass material containing lead. Where the lead glass is used, the amount of lead in the glass material is preferably appropriately set in accordance with the required level of the radiation shielding function or the like in the radiation detector. It is also possible to use another glass material with the radiation shielding function except for the lead glass. In cases where the radiation shield is not required or where the aforementioned semiconductor device is applied to device except for the radiation detector, the insulating substrate may be made of a glass material without the radiation shielding function, or an insulating material except for the glass materials, as described above about FIG. 1.

The following will describe an example of the configuration of the glass substrate used for the wiring substrate in the semiconductor device shown in FIG. 1, and in the radiation detector shown in FIG. 9, and a production method thereof, using FIGS. 11A to 14C. The example herein indicates a general configuration example of the glass substrate with through holes and a production method thereof. For this reason, the glass substrate described below has the shape and configuration different from those of the wiring substrate used in the above-described semiconductor device and radiation detector.

First, as shown in FIG. 11A, a base material 61, which includes a core glass portion 63, and a coating glass portion 65 provided around the core glass portion, is prepared. This base material 61 has, for example, the outer diameter of about 40-45 mm and the outer diameter of the core glass portion 63 is, for example, approximately 28-31 mm. The core glass portion 63 is made of an acid-soluble glass, and the coating glass portion 65 is made of lead glass, soda lime glass, Kovar glass, pyrex glass, or the like. As shown in FIG. 11B, the base material 61 is drawn to fabricate glass fiber 67 being a glass member of fiber shape. The outer diameter of glass fiber 67 is, for example, approximately 0.4 mm.

Then, as shown in FIG. 11C, a plurality of such glass fibers 67 are bundled to be arrayed in a predetermined mold 69. The mold used herein is mold 69 of hexagonal shape, when viewed from the direction of the center axis of the glass fibers 67, and approximately 10,000 glass fibers 67 are loaded in the mold. This results in arraying the glass fibers 67 in the hexagonal shape when viewed from the direction of the center axis thereof, as shown in FIG. 11D. Alternatively, it is also possible to use a mold of triangular shape or rectangular shape, when viewed from the direction of the center axis of the glass fibers 67, so that the glass fibers 67 are arrayed in triangular shape or rectangular shape when viewed from the direction of the center axis thereof.

Subsequently, as shown in FIG. 11E, the bundle of glass fibers 67 are drawn in the arrayed state to fabricate multi-fiber 71. The outer diameter of the multi-fiber 71 is, for example, approximately 0.7 mm.

Then, as shown in FIG. 12A, a plurality of multi-fibers 71 thus drawn are arrayed and set in a predetermined glass tube 73. The inner diameter of glass tube 73 is approximately 100 mm. Then, as shown in FIG. 12B, the multi-fibers 71 in the glass tube 73 are heated and bonded to each other. At this time, a glass tube 75 narrower than the foregoing glass tube is connected to one end of the glass tube 73, and internal pressure is lowered as evacuated with a rotary pump or the like, whereby the glass tube 73 and the multi-fibers 71 inside thereof can be thermally bonded to each other in contact without clearance by atmospheric pressure during the heating.

The temperature of the heating is, for example, about 600° C. and the internal pressure about 0.5 Pa. The other end of the glass tube 73 is sealed. Through the above steps, the bundled glass member 77 is formed in the state in which the plurality of multi-fibers 71 are thermally bonded in the glass tube 73.

Figure 13A:
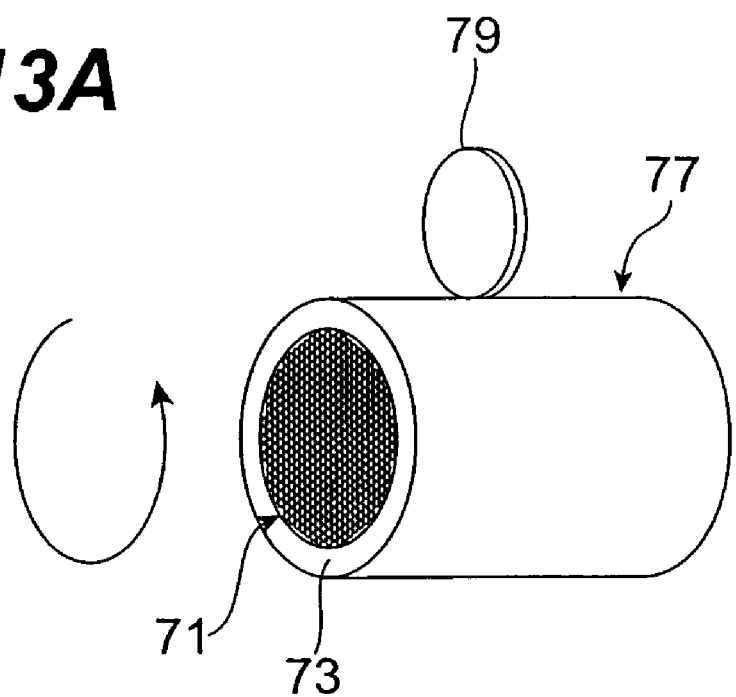
FIGS. 13A and 13B are illustrations showing an example of a production method of a wiring substrate.

Subsequently, the glass tube 75 and the sealing part are removed. Thereafter, as shown in FIG. 13A, the outer periphery of the glass tube 73 is polished with grinding stone 79 or the like to shape the bundled glass member 77 (to adjust the outer diameter). This step of adjusting the outer diameter of the bundled glass member 77 can be performed with a periphery polishing machine.

Figure 13B:
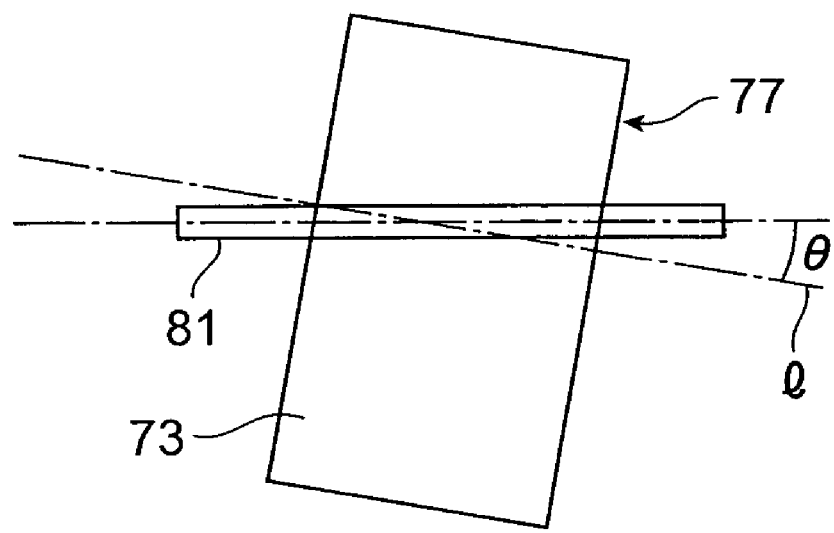

Then the bundled glass member 77 is cut into a desired thickness, as shown in FIG. 13B. At this time, the bundled glass member 77 is cut along an axis 1 perpendicular to the center axis thereof with slicer 81, whereby the glass substrate is obtained in a shape with the center axis of the through holes extending along the axis normal to the upper surface and the lower surface, as in the wiring substrate 20 shown in FIG. 1.

Figure 14A:
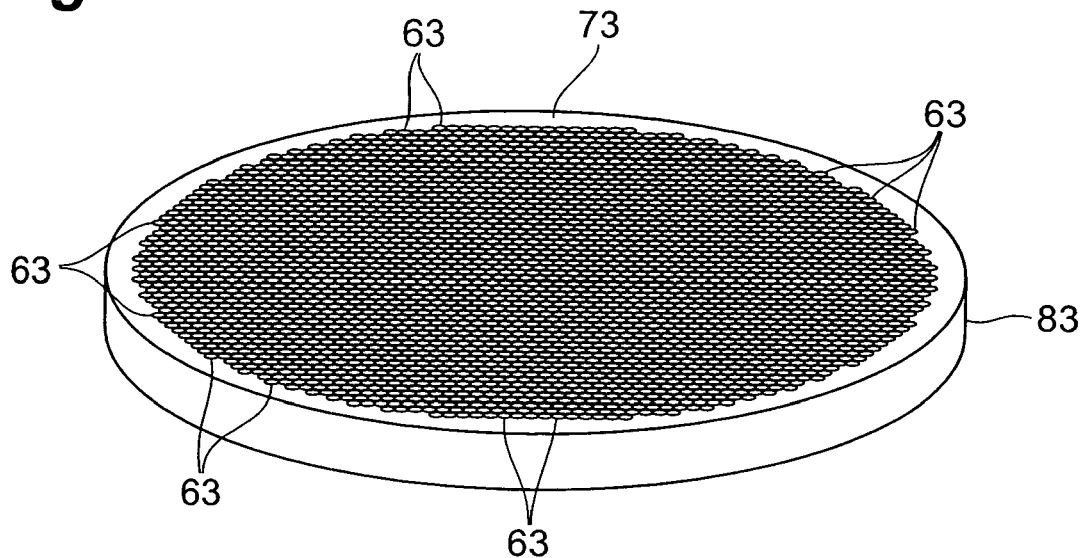
FIGS. 14A to 14C are illustrations showing an example of a production method of a wiring substrate.
Figure 14B:
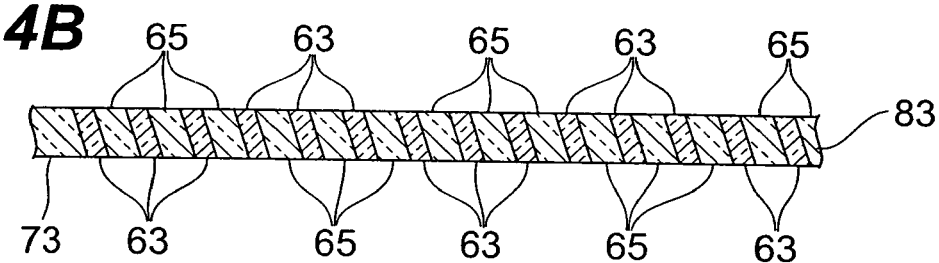

Alternatively, as shown in FIG. 13B, the bundled glass member 77 may be cut with slicer 81 so that the cut plane is oblique at a predetermined angle θ relative to the axis 1 perpendicular to the center axis. Furthermore, the cut plane is polished after the glass member is cut with the slicer 81. These steps result in forming a platelike glass member 83, as shown in FIGS. 14A and 14B. The example herein shows the glass member 83 obtained by cutting obliquely at the angle θ.

Figure 14C:
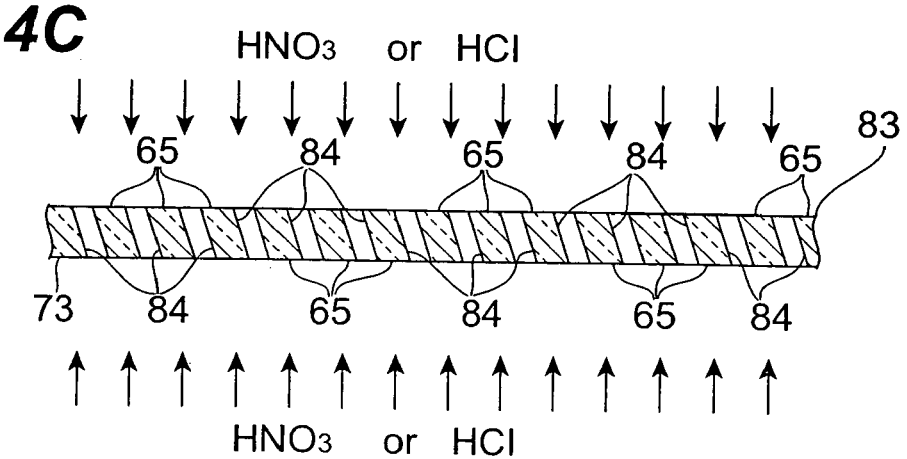

Subsequently, as shown in FIG. 14C, the core glass portions 63 are removed from the platelike glass member 83 (core removal). At this time, $HNO_3$ or HCl is used to remove the core glass portions 63 by etching. This results in forming a plurality of through holes 84 which pass through the platelike glass member 83 in the thickness direction, and thus forming the glass substrate with through holes.

The wiring substrate 20 in the aforementioned semiconductor device and in the radiation detector using it can be, for example, one obtained by forming conductive members as conduction paths in the through holes in the glass substrate obtained by the above-described production method. Namely, in the glass substrate of this configuration, the shape of the substrate and the number, arrangement, etc. of the through holes are set according to the configuration of the semiconductor device or the radiation detector.

Then the conductive members as conduction paths are formed in the through holes provided in the glass substrate, and an electric wiring pattern consisting of necessary electrodes and wires is formed on each of surfaces of the substrate, thereby obtaining the wiring substrate having the configuration as shown in FIGS. 1 and 2. In FIG. 2, the arrangement of the multi-fibers of hexagonal shape consisting of a plurality of glass fibers in use of the glass substrate of the above configuration is illustrated by dotted lines on the upper surface 20a of the wiring substrate 20.

Next, a production method of the radiation detector shown in FIG. 9 will be schematically described with a specific configuration example thereof, together with a production method of the semiconductor device shown in FIG. 1.

The first step is to prepare the glass substrate provided with through-hole groups each having a plurality of through holes obtained by cutting the bundled glass member as a bundle of glass fibers and removing the predetermined core glass portions as described above. Then the conductive members as conduction paths are formed in the through holes and an electric wiring pattern with necessary electrodes and wires is formed on each of the two surfaces intended for the input surface and the output surface, thereby fabricating the wiring substrate 20 used in the semiconductor device 5.

In the configuration shown in FIGS. 1 and 9, the conductive members 21 each consisting of conducting portion 21c, input portion 21a, and output portion 21b are formed in the respective through holes 20c in the through-hole groups 20d provided in the glass substrate, for the wiring substrate in the semiconductor device 5. Furthermore, the conductive parts 22 corresponding to the respective through-hole groups 20d are formed on the input surface 20a, and the conductive parts 23 are also similarly formed on the output surface 20b, thereby forming the wiring substrate 20.

The conductive members and electric wiring patterns formed on the glass substrate can be made, for example, of a conductive metal layer of titanium nitride (TiN), nickel (Ni), aluminum (Al), chromium (Cr), copper (Cu), silver (Ag), gold (Au), or one of alloys of these metals. This metal layer may be a single metal layer, or may be a composite film or a multilayer film. Specific methods of forming the metal layer can be methods such as vapor deposition, CVD, plating, sputtering, and so on, and a desired pattern can be formed on the glass substrate by the photolithography and etching process. Another possible method is to form a mask in a desired pattern on the glass substrate, then form the metal layer by the aforementioned method, and then remove the mask (mask vapor deposition, lift-off process, and so on). In certain cases bump electrodes are further formed on the wiring substrate 20 if necessary.

After fabrication of the wiring substrate 20, an IC chip of signal processing element 30 with bump electrodes 31 formed thereon is aligned with respect to the conductive parts 23 functioning as electrode pads on the output surface 20b of the wiring substrate 20, and those are physically and electrically connected. The PD array 10 with bump electrodes 12 formed thereon is also aligned with respect to the conductive parts 22 functioning as electrode pads on the input surface 20a of the wiring substrate 20, and those are physically and electrically connected.

A bump material for forming the bump electrodes 31, 12 can be, for example, a metal such as tin (Sn), lead (Pb), indium (In), gold (Au), or copper (Cu), solder containing the metal, a resin containing a conductive filler, or one of composite materials of those materials, and a layer structure can be adopted. Furthermore, under bump metal (UBM) may be interposed between each bump electrode and an electrode pad under it.

In mounting with the bump electrodes, it is preferable to preliminarily heat the wiring substrate 20 at a predetermined temperature near the melting point of the bump electrode material of about 100° C. This causes the air to expand inside the through holes 20c in the wiring substrate 20.

Next, the wiring substrate 20 is aligned with the chip of PD array 10 or signal processing element 30, and thereafter the chip is heated to be mounted on the wiring substrate 20. At this point the bumps melt, or the bumps soften. Then the wiring substrate 20 and the mounted chip are rapidly cooled with a blow of air or nitrogen. At this time, the air having expanded inside the through holes 20c comes to contract, whereupon the bump electrode material flows on the surface of the conductive members 21 into the interior of through holes 20c, so as to achieve good connection between the bump electrodes and conductive members 21.

Subsequently, the housing 40 with bump electrodes 44 formed thereon is aligned with respect to corresponding electrode pads (not shown) provided on the output surface 20b of the wiring substrate 20, and those are physically and electrically connected. The above enables the input/output operation of signals through the leads 43 provided on the housing 40, from and to an external circuit. Furthermore, the scintillator 15 is mounted through optical adhesive 16 on the light-incident surface 10a of the PD array 10, thereby obtaining the radiation detector shown in FIG. 9.

It is noted herein that the PD array 10 provided as a semiconductor photodetecting element array in the semiconductor device 5 may be of a front incident type in which the photodiodes are formed on the light-incident surface (front surface) 10a, or of a back incident type in which the photodiodes are formed on the signal output surface (back surface) 10b. The number, arrangement, etc. of the photodiodes being the photodetecting elements may also be optionally set.

The configuration of outputting the detected signals from the photodiodes via the output surface 10b can be determined according to the specific configuration of the PD array; for example, it is possible to use a configuration based on a wiring pattern formed on the output surface 10b, a configuration based on through electrodes formed in the PD array 10, and so on.

The radiation detector shown in FIG. 9 adopts as the configuration of the radiation detecting section 1, the configuration having the scintillator 15 for generating the scintillation light with incidence of the radiation, and the PD array 10 with photodiodes 11 as semiconductor photodetecting elements for detecting the scintillation light from the scintillator 15. This configuration is of an indirect detection type in which the scintillator 15 converts the incident radiation such as X-rays into light of a predetermined wavelength (e.g., visible light) and in which the semiconductor photodetecting elements such as an Si—PD array then detect the light.

Alternatively, it is also possible to use a configuration having semiconductor detecting elements for detecting the incident radiation, without provision of the scintillator, as the radiation detecting section. This configuration is of a direct detection type in which the semiconductor detecting elements of CdTe, CdZnTe, or the like detect the incident radiation such as X-rays. In another configuration, it can also be realized by using Si in a thickness enough to be completely depleted, or by adopting a structure permitting incidence from the back side. This is equivalent, for example, to a configuration obtained by removing the scintillator 15 and replacing the PD array 10 with a semiconductor detecting element array in the configuration of FIG. 9. In this case, the semiconductor detecting element array and the wiring substrate constitute the semiconductor device.

The semiconductor device of the above configuration consisting of the semiconductor element and the wiring substrate can also be applied to various device except for the radiation detectors. In this case, the semiconductor element may be an element other than the semiconductor photodetecting elements and semiconductor detecting elements. Another semiconductor device may be configured in such a manner that, in addition to the wiring substrate, and the semiconductor element connected to the signal input surface of the wiring substrate, a signal processing element is connected to the signal output surface of the wiring substrate and that the semiconductor element and the signal processing element for processing electrical signals from the semiconductor element are integrated through the wiring substrate.

The connection between wiring substrate 20 and signal processing element 30 or the like is preferably achieved by the direct bonding method using the electric connection through the bump electrodes, as in the above embodiment. By using such metal bump electrodes as electric connection means, each of the sections can be suitably electrically connected.

In the radiation detector shown in FIG. 9, the conductive parts 23 are provided on the output surface 20b of the wiring substrate 20 as on the input surface 20a, and the bump electrodes 31 on the signal processing element 30 are connected using them as electrode pads. This achieves good connection through bump electrodes 31 between wiring substrate 20 and signal processing element 30. The electrode pads on the output surface 20b may be arranged in the configuration in which the electrode pads are provided separately from the conductive parts 23 including the output portions 21b of the conductive members 21.

In addition to the configuration using such bump electrodes, it is also possible to use a configuration of filling an under fill resin after connection with the bump electrodes, one of configurations using the anisotropic conductive film (ACF) method, the anisotropic conductive paste (ACP) method, and the nonconductive paste (NCP) method, or the like. For each of the substrates, a passivation film of an insulating material may be formed in an open state of the electrode pads if necessary.

INDUSTRIAL APPLICABILITY

The semiconductor device according to the present invention and the radiation detector using it can be applied as a semiconductor device achieving good connection between the semiconductor element and the corresponding conduction path in the wiring substrate, and as a radiation detector using it, as detailed above. Namely, the insulating substrate having the through-hole group consisting of a plurality of through holes formed in the predetermined array from the input surface to the output surface is used as the wiring substrate for connection of the semiconductor element such as the semiconductor photodetecting elements, and the semiconductor element is configured to be connected to the conductive members as conduction paths provided in the corresponding through-hole group in the wiring substrate while keeping the bump electrode of the semiconductor element corresponding to this through-hole group; in this configuration, on the occasion of mounting the semiconductor element on the wiring substrate, a portion of the bump electrode enters into the interior of each of the through holes in the through-hole group provided with the conductive members. This realizes the semiconductor device achieving the good connection through the bump electrode between the semiconductor element and the corresponding conduction path in the wiring substrate.

Since the radiation detector to which the semiconductor device of the above configuration is applied achieves the good connection between the semiconductor element and the corresponding conductive members in the wiring substrate, the radiation detector is realized so as to be able to securely achieve the transmission of detected signals from the radiation detecting means to the signal processing means and the processing of detected signals in the signal processing means.

The invention claimed is:

1. A semiconductor device comprising:
    a semiconductor element arranged to output an electrical signal; and
    a wiring substrate provided with a conduction path for guiding the electrical signal between a signal input surface and a signal output surface, wherein the semiconductor element is connected to the signal input surface;
    wherein the wiring substrate comprises an insulating substrate with a through-hole group consisting of a plurality of through holes, and conductive members provided in the respective through holes in the through-hole group and functioning as the conduction path while establishing electrical continuity between the signal input surface and the signal output surface, and
    wherein the semiconductor element is electrically connected to the conductive members provided in the through-hole group of the wiring substrate, via a bump electrode formed corresponding to the through-hole group.

2. The semiconductor device according to claim 1, wherein each of the conductive members is formed on an inner wall of the through hole provided in the insulating substrate.

3. The semiconductor device according to claim 1, wherein the insulating substrate is a glass substrate with the through holes therein obtained by cutting a bundle of glass members, which are formed by bundling glass members of fiber shape each comprised of a core glass portion and a coating glass portion around the core glass portion, into a desired thickness and removing the core glass portions to form the through holes.

4. The semiconductor device according to claim 1, comprising signal processing means connected to the signal output surface of the wiring substrate and arranged to process the electrical signal from the semiconductor element.

5. A radiation detector comprising the semiconductor device as set forth in claim 4,
    the radiation detector comprising:
    radiation detecting means including the semiconductor element, and arranged to detect an incident radiation to output the electrical signal;
    the signal processing means for processing the electrical signal from the radiation detecting means; and
    a wiring substrate section including the wiring substrate, wherein the radiation detecting means and the signal processing means are connected to the signal input surface and to the signal output surface, respectively.

6. The radiation detector according to claim 5, wherein the insulating substrate used in the wiring substrate is a glass substrate made of a predetermined material with a radiation shielding function.

7. The radiation detector according to claim 5, wherein the radiation detecting means comprises a scintillator for generating scintillation light with incidence of the radiation, and a semiconductor photodetecting element as the semiconductor element for detecting the scintillation light from the scintillator.

8. The radiation detector according to claim 5, wherein the radiation detecting means has a semiconductor detecting element as the semiconductor element for detecting the incident radiation.

* * * * *